United States Patent
Nakayama

(10) Patent No.: US 7,616,007 B2
(45) Date of Patent: Nov. 10, 2009

(54) DEVICE, METHOD, PROGRAM, AND RECORDING MEDIUM FOR ERROR FACTOR MEASUREMENT, AND OUTPUT CORRECTION DEVICE AND REFLECTION COEFFICIENT MEASUREMENT DEVICE PROVIDED WITH THE DEVICE FOR ERROR FACTOR MEASUREMENT

(75) Inventor: Yoshikazu Nakayama, Saitama (JP)

(73) Assignee: Advantest Corporation, Tokyo (JP)

( * ) Notice: Subject to any disclaimer, the term of this patent is extended or adjusted under 35 U.S.C. 154(b) by 232 days.

(21) Appl. No.: 11/864,086

(22) Filed: Sep. 28, 2007

(65) Prior Publication Data

US 2009/0031172 A1 Jan. 29, 2009

(30) Foreign Application Priority Data

Jul. 23, 2007 (JP) ............... 2007-190348

(51) Int. Cl.
*G01R 15/00* (2006.01)
(52) U.S. Cl. ..................... 324/601; 702/90
(58) Field of Classification Search ............ 324/601; 702/85, 90
See application file for complete search history.

(56) References Cited

U.S. PATENT DOCUMENTS

| | | | |
|---|---|---|---|
| 5,097,215 A * | 3/1992 | Eul et al. ............ | 324/601 |
| 6,147,501 A | 11/2000 | Chodora | |
| 6,188,968 B1 | 2/2001 | Blackham | |
| 7,075,312 B2 * | 7/2006 | Fabry et al. ............ | 324/601 |
| 2005/0140377 A1 | 6/2005 | Komatsu | |
| 2005/0289392 A1 | 12/2005 | Haruta et al. | |
| 2006/0005065 A1 | 1/2006 | Nakayama et al. | |
| 2007/0233410 A1 | 10/2007 | Komatsu | |

FOREIGN PATENT DOCUMENTS

| | | |
|---|---|---|
| JP | 11-38054 | 2/1999 |
| JP | 11-118853 A | 4/1999 |
| JP | 11-352163 A | 12/1999 |
| JP | 2005-172728 A | 6/2005 |
| WO | 03/087856 | 10/2003 |

(Continued)

OTHER PUBLICATIONS

English language Abstract of JP 11-38054.

(Continued)

*Primary Examiner*—Vincent Q Nguyen
(74) *Attorney, Agent, or Firm*—Greenblum & Bernstein, P.L.C.

(57) ABSTRACT

There is provided an error factor measurement device for measuring an error factor in a switch branch signal source including a signal source and a switch, and the error factor measurement device includes a reference error factor component recording unit which records respective components $E12a$, $E21a$ of a frequency tracking error factor when a predetermined output terminal is connected to a signal source, a derived error factor product recording unit which records an error factor product $E12b \times E21b$ which is a product of respective components of a frequency tracking error factor when respective multiple output terminals other than predetermined output terminal are connected to the signal source, an error factor ratio deriving unit which derives an error factor ratio $E21a/E12a$, and a frequency tracking error factor deriving unit which derives $E12b$, $E21b$ based on the error factor product and the error factor ratio, where $E21a/E12a = E21b/E12b$ holds.

12 Claims, 12 Drawing Sheets

FOREIGN PATENT DOCUMENTS

| WO | 2004/049564 | 6/2004 |
| WO | 2008/026711 | 3/2008 |

OTHER PUBLICATIONS

U.S. Appl. No. 11/861,453 to Nakayama, filed Sep. 26, 2007.
English language Abstract of JP 11-118853 A.
English language Abstract of JP 11-352163 A.
English language Abstract of JP 2005-172728 A.
User's and Service Guide Agilent Technologies 85057B 2.4 mm Verification Kit, Agilent Technologies, Nov. 2005.

\* cited by examiner

First Switch Portion
Error Factor Qija
(where i=1, 2; j=1, 2)

Second Switch Portion
Error Factor Qijb
(where i=1, 2; j=1, 2)

Third Switch Portion
Error Factor Qijc
(where i=1, 2; j=1, 2)

Fourth Switch Portion
Error Factor Qijd
(where i=1, 2; j=1, 2)

Signal Source Error Factor Pij
(where i=1, 2; j=1, 2)

DEVICE, METHOD, PROGRAM, AND RECORDING MEDIUM FOR ERROR FACTOR MEASUREMENT, AND OUTPUT CORRECTION DEVICE AND REFLECTION COEFFICIENT MEASUREMENT DEVICE PROVIDED WITH THE DEVICE FOR ERROR FACTOR MEASUREMENT

TECHNICAL FIELD

The present invention relates to a calibration for a switch branch signal source constructed by combining a signal source which generates a signal, and a switch which outputs the generated signal to any one of multiple ports.

BACKGROUND ART

Conventionally, there have been measured circuit parameters (such as the S parameters) of a device under test (DUT) (refer to a patent document 1 (Japanese Laid-Open Patent Publication (Kokai) No. H11(1999)-38054, for example)).

Specifically, a signal is transmitted from a signal source to a receiving unit via the DUT. The signal is received by the receiving unit. It is possible to acquire the S parameters and frequency characteristics of the DUT by measuring the signal received by the receiving unit.

On this occasion, measuring system errors are generated in the measurement due to mismatching between a measuring system such as the signal source and the DUT, and the like. These measuring system errors include Ed: error caused by the direction of a bridge, Er: error caused by frequency tracking, and Es: error caused by source matching.

On this occasion, it is possible to correct the errors as described in the patent document 1, for example. The correction in this way is referred to as calibration. A brief description will now be given of the calibration. Calibration kits are connected to the signal source to realize three types of states: open, short-circuit, and load (standard load Z0). In these states, a signal reflected from the respective calibration kits is acquired by a bridge to obtain three types of the S parameter corresponding to the three types of state. The three types of variable Ed, Er, and Es are acquired from the three types of the S parameter, and then are corrected.

It should be noted that Er is represented as a product of an error Er1 relating to an input of a signal, and an error Er2 relating to a reflection of the signal. On this occasion, it is possible to connect a power meter to the signal source to measure the power thereby measuring the errors Er1 and Er2 (refer to a patent document 2 (WO 2004/049564 pamphlet), for example).

The calibration described above can be applied to a switch branch signal source. It should be noted that the switch branch signal source is a combination of a signal source which generates a signal, and a switch which outputs the generated signal to any one of multiple ports. If the above calibration is applied to a switch branch signal source, three states including an open state, a short-circuit state, and a load state (with a standard load of Z0) will be realized for the respective multiple ports, and a power meter is also connected.

DISCLOSURE OF THE INVENTION

However, since it is necessary to realize the three states for the respective multiple ports for the switch branch signal source, and also to connect a power meter, large labor will be spent on the calibration.

It is an object of the present invention to easily carry out the calibration of a switch branch signal source.

According to the present invention, an error factor measurement device measures an error factor in a switch branch signal source including a signal source which generates a signal, and a switch which outputs the signal from any one of multiple output terminals. The error factor measurement device includes: a reference error factor component recording unit that records a component in an output direction (referred to as "reference output direction component") and a component in an input direction (referred to as "reference input direction component") of an error factor caused by frequency tracking in the switch branch signal source upon any predetermined one of the multiple output terminals being connected to the signal source; a derived error factor product recording unit that records an error factor product of a component in the output direction (referred to as "derived output direction component") and a component in the input direction (referred to as "derived input direction component") of an error factor caused by frequency tracking in the switch branch signal source upon respective multiple output terminals other than the predetermined one of the multiple output terminals being connected to the signal source; an error factor ratio deriving unit that derives an error factor ratio, which is a ratio of the reference output direction component to the reference input direction component, based on records of the reference error factor component recording unit; and a frequency tracking error factor deriving unit that derives the derived output direction component and the derived input direction component based on the error factor product recorded in the derived error factor product recording unit and the error factor ratio derived by the error factor ratio deriving unit; wherein the frequency tracking error factor deriving unit derives the derived output direction component and the derived input direction component assuming that the error factor ratio is equal to the ratio of the derived output direction component to the derived input direction component.

According to the present invention, an error factor measurement device that measures an error factor in a switch branch signal source including a signal source which generates a signal, and a switch which outputs the signal from any one of multiple output terminals can be provided.

A reference error factor component recording unit records a component in an output direction (referred to as "reference output direction component") and a component in an input direction (referred to as "reference input direction component") of an error factor caused by frequency tracking in the switch branch signal source upon any predetermined one of the multiple output terminals being connected to the signal source. A derived error factor product recording unit records an error factor product of a component in the output direction (referred to as "derived output direction component") and a component in the input direction (referred to as "derived input direction component") of an error factor caused by frequency tracking in the switch branch signal source upon respective multiple output terminals other than the predetermined one of the multiple output terminals being connected to the signal source. An error factor ratio deriving unit derives an error factor ratio, which is a ratio of the reference output direction component to the reference input direction component, based on records of the reference error factor component recording unit. A frequency tracking error factor deriving unit derives the derived output direction component and the derived input direction component based on the error factor product recorded in the derived error factor product recording unit and the error factor ratio derived by the error factor ratio deriving unit. The frequency tracking error factor deriving unit derives the derived output direction component and the derived input direction component assuming that the error factor ratio is equal to the ratio of the derived output direction component to the derived input direction component.

The error factor measurement device according to the present invention may include an error factor recording unit that records a component caused by the direction of the switch branch signal source, and a component caused by source matching of the switch branch signal source of the error factor in the switch branch signal source when the respective multiple output terminals are connected to the signal source.

According to the error factor measurement device of the present invention, the reference output direction component and the reference input direction component recorded in the reference error factor component recording unit may be derived based on a result of a measurement of an output from the predetermined one of the multiple output terminals, and a result of a measurement of the signal before the error factor is generated, and a result of a measurement of a reflection of the signal while a calibration tool is connected to the predetermined one of the multiple output terminals, and the calibration tool realizes three states including an open state, a short-circuit state, and a standard load state.

According to the error factor measurement device of the present invention, the error factor product recorded in the derived error factor product recording unit may be derived based on a result of a measurement of the signal before the error factor is generated, and a result of a measurement of a reflection of the signal while a calibration tool is connected to the respective multiple output terminals other than the predetermined one of the multiple output terminals, and the calibration tool realizes three states including an open state, a short-circuit state, and a standard load state.

According to the present invention, an output correction device includes: the error factor measurement device according to the present invention; and a signal power adjustment unit that adjusts power of the signal based on the error factor measured by the error factor measurement device.

According to the present invention, a reflection coefficient measurement device includes: the error factor measurement device according to the present invention; and a reflection coefficient measurement unit that measures a reflection coefficient of a device under test based on a result of a measurement of the signal before the error factor is generated, a result of a measurement of a reflection of the signal, and the error factor measured by the error factor measurement device while the device under test is connected to any one of the multiple output terminals.

The present invention is an error factor measurement method that measures an error factor in a switch branch signal source including a signal source which generates a signal, and a switch which outputs the signal from any one of multiple output terminals, the error factor measurement method including: a reference error factor component recording step that records a component in an output direction (referred to as "reference output direction component") and a component in an input direction (referred to as "reference input direction component") of an error factor caused by frequency tracking in the switch branch signal source upon any predetermined one of the multiple output terminals being connected to the signal source; a derived error factor product recording step that records an error factor product of a component in the output direction (referred to as "derived output direction component") and a component in the input direction (referred to as "derived input direction component") of an error factor caused by frequency tracking in the switch branch signal source upon respective multiple output terminals other than the predetermined one of the multiple output terminals being connected to the signal source; an error factor ratio deriving step that derives an error factor ratio, which is a ratio of the reference output direction component to the reference input direction component, based on records of the reference error factor component recording step; and a frequency tracking error factor deriving step that derives the derived output direction component and the derived input direction component based on the error factor product recorded in the derived error factor product recording step and the error factor ratio derived by the error factor ratio deriving step; wherein the frequency tracking error factor deriving step derives the derived output direction component and the derived input direction component assuming that the error factor ratio is equal to the ratio of the derived output direction component to the derived input direction component.

The present invention is a program of instructions for execution by the computer to perform an error factor measurement processing that measures an error factor in a switch branch signal source including a signal source which generates a signal, and a switch which outputs the signal from any one of multiple output terminals, the error factor measurement processing including: a reference error factor component recording step that records a component in an output direction (referred to as "reference output direction component") and a component in an input direction (referred to as "reference input direction component") of an error factor caused by frequency tracking in the switch branch signal source upon any predetermined one of the multiple output terminals being connected to the signal source; a derived error factor product recording step that records an error factor product of a component in the output direction (referred to as "derived output direction component") and a component in the input direction (referred to as "derived input direction component") of an error factor caused by frequency tracking in the switch branch signal source upon respective multiple output terminals other than the predetermined one of the multiple output terminals being connected to the signal source; an error factor ratio deriving step that derives an error factor ratio, which is a ratio of the reference output direction component to the reference input direction component, based on records of the reference error factor component recording step; and a frequency tracking error factor deriving step that derives the derived output direction component and the derived input direction component based on the error factor product recorded in the derived error factor product recording step and the error factor ratio derived by the error factor ratio deriving step; wherein the frequency tracking error factor deriving step derives the derived output direction component and the derived input direction component assuming that the error factor ratio is equal to the ratio of the derived output direction component to the derived input direction component.

The present invention is a computer-readable medium having a program of instructions for execution by the computer to perform an error factor measurement processing that measures an error factor in a switch branch signal source including a signal source which generates a signal, and a switch which outputs the signal from any one of multiple output terminals, the error factor measurement processing including: a reference error factor component recording step that records a component in an output direction (referred to as "reference output direction component") and a component in an input direction (referred to as "reference input direction component") of an error factor caused by frequency tracking in the switch branch signal source upon any predetermined one of the multiple output terminals being connected to the signal source; a derived error factor product recording step that records an error factor product of a component in the output direction (referred to as "derived output direction component") and a component in the input direction (referred to as "derived input direction component") of an error factor caused by frequency tracking in the switch branch signal source upon respective multiple output terminals other than the predetermined one of the multiple output terminals being connected to the signal source; an error factor ratio deriving step that derives an error factor ratio, which is a ratio of the reference output direction component to the reference input direction component, based on records of the reference error factor component recording step; and a frequency tracking error factor deriving step that derives the derived output direction component and the derived input direction component based on the error factor product recorded in the derived error factor product recording step and the error factor ratio derived by the error factor ratio deriving step; wherein the frequency tracking error factor deriving step derives the derived output direction component and the derived input direction component assuming that the error factor ratio is equal to the ratio of the derived output direction component to the derived input direction component.

According to the present invention, a module for a test device includes the error factor measurement device according to the present invention.

According to the present invention, a test device includes the output correction device according to the present invention, wherein the signal is fed to a device under test.

According to the present invention, a test device for testing a device under test includes the reflection coefficient measurement device according to the present invention.

BRIEF DESCRIPTION OF THE DRAWINGS

FIG. 8 shows the state in which a power meter 64 is connected to the output terminal 19a, and the mixer 16a is connected to the terminal 21a;

BEST MODE FOR CARRYING OUT THE INVENTION

A description will now be given of an embodiment of the present invention with reference to drawings.

Figure 1:
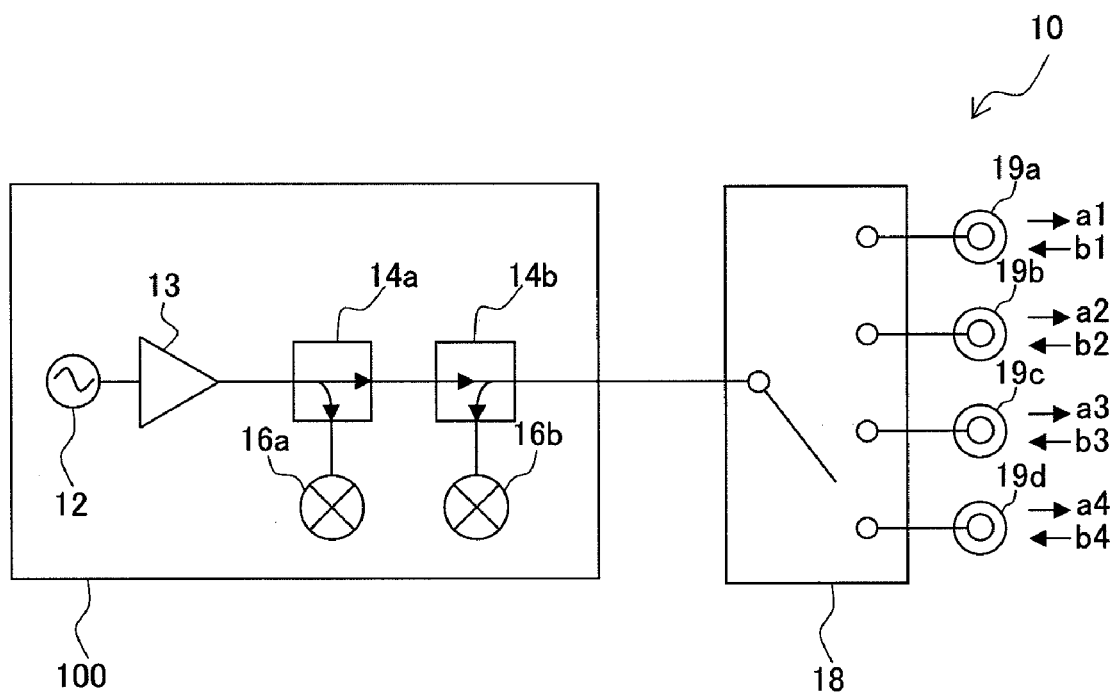
FIG. 1 shows a configuration of a switch branch signal source 10.

FIG. 1 shows a configuration of a switch branch signal source 10. The switch branch signal source 10 includes a signal source 100, a switch 18, and output terminals 19a, 19b, 19c, and 19d.

The signal source 100 generates a signal. The signal source 100 includes a signal generation unit 12, an amplifier 13, bridges 14a, 14b, and mixers 16a, 16b.

The signal generation unit 12 generates a signal (such as a high frequency signal). The amplifier 13 amplifies the signal generated by the signal generation unit 12.

The bridge 14a receives the output of the amplifier 13, and branches the output into two directions. The mixer 16a receives one of the outputs of the bridge 14a, and multiplies it by a local signal with a predetermined local frequency. It should be noted that the local signal is not illustrated. An output of the mixer 16a is a result of a measurement of the signal before an error factor in the signal source 100 is generated.

The bridge 14b receives and directly outputs the other one of the outputs of the bridge 14a. It should be noted that the bridge 14b receives a reflection of the signal (reflected signal) from the output side, and supplies the mixer 16b with the reflected signal. The mixer 16b multiplies the reflected signal and a local signal by each other. It should be noted that the local signal is not illustrated. The output of the mixer 16b is a result of a measurement of the reflected signal.

The switch 18 is connected to the signal source 100, and outputs the signal from any one of output terminals 19a, 19b, 19c, and 19d.

Any one of the output terminals 19a, 19b, 19c, and 19d is connected to the signal source 100 by the switch 18. Then, the output terminal connected to the signal source 100 outputs the signal.

On this occasion, if the signal is output from the output terminal 19a, an S parameter of the output terminal 19a is a1, and an S parameter of the output reflected back to the output terminal 19a is b1.

If the signal is output from the output terminal 19b, an S parameter of the output terminal 19b is a2, and an S parameter of the output reflected back to the output terminal 19b is b2.

If the signal is output from the output terminal 19c, an S parameter of the output terminal 19c is a3, and an S parameter of the output reflected back to the output terminal 19c is b3.

If the signal is output from the output terminal 19d, an S parameter of the output terminal 19d is a4, and an S parameter of the output reflected back to the output terminal 19d is b4.

Figure 2:
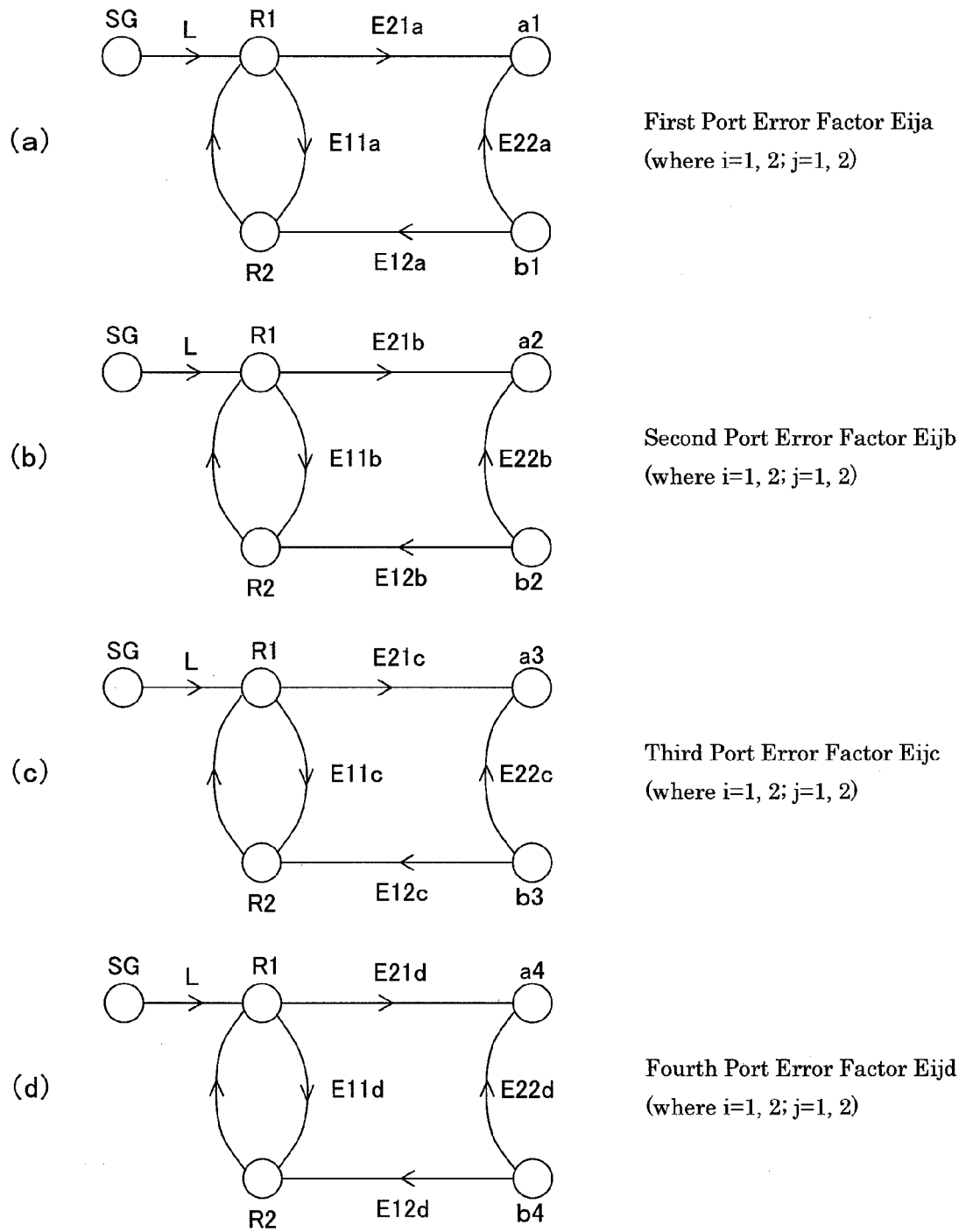
FIG. 2 shows signal flow graphs of the switch branch signal source 10.

FIGS. 2(a) to 2(d) are signal flow graphs of the switch branch signal source 10. FIG. 2(a) is a signal flow graph when the signal source 100 is connected to the output terminal 19a. FIG. 2(b) is a signal flow graph when the signal source 100 is connected to the output terminal 19b. FIG. 2(c) is a signal flow graph when the signal source 100 is connected to the output terminal 19c. FIG. 2(d) is a signal flow graph when the signal source 100 is connected to the output terminal 19d.

In FIGS. 2(a) to 2(d), SG denotes an output of the signal generation unit 12, R1 denotes an output of the mixer 16a, and R2 denotes an output of the mixer 16b. Moreover, there holds R1=SG×L as shown in FIG. 2, where L (S parameter) is an error factor caused by the amplifier 13.

With reference to FIG. 2(a), it is observed that if the signal source 100 is connected to the output terminal 19a, error factors E11a, E12a, E21a, and E22a (S parameters) are generated. The error factors E11a, E12a, E21a, and E22a are referred to as first port error factors.

With reference to FIG. 2(b), it is observed that if the signal source 100 is connected to the output terminal 19b, error factors E11b, E12b, E21b, and E22b (S parameters) are generated. The error factors E11b, E12b, E21b, and E22b are referred to as second port error factors.

With reference to FIG. 2(c), it is observed that if the signal source 100 is connected to the output terminal 19c, error factors E11c, E12c, E21c, and E22c (S parameters) are generated. The error factors E11c, E12c, E21c, and E22c are referred to as third port error factors.

With reference to FIG. 2(d), it is observed that if the signal source 100 is connected to the output terminal 19d, error factors E11d, E12d, E21d, and E22d (S parameters) are generated. The error factors E11d, E12d, E21d, and E22d are referred to as fourth port error factors.

Figure 3:
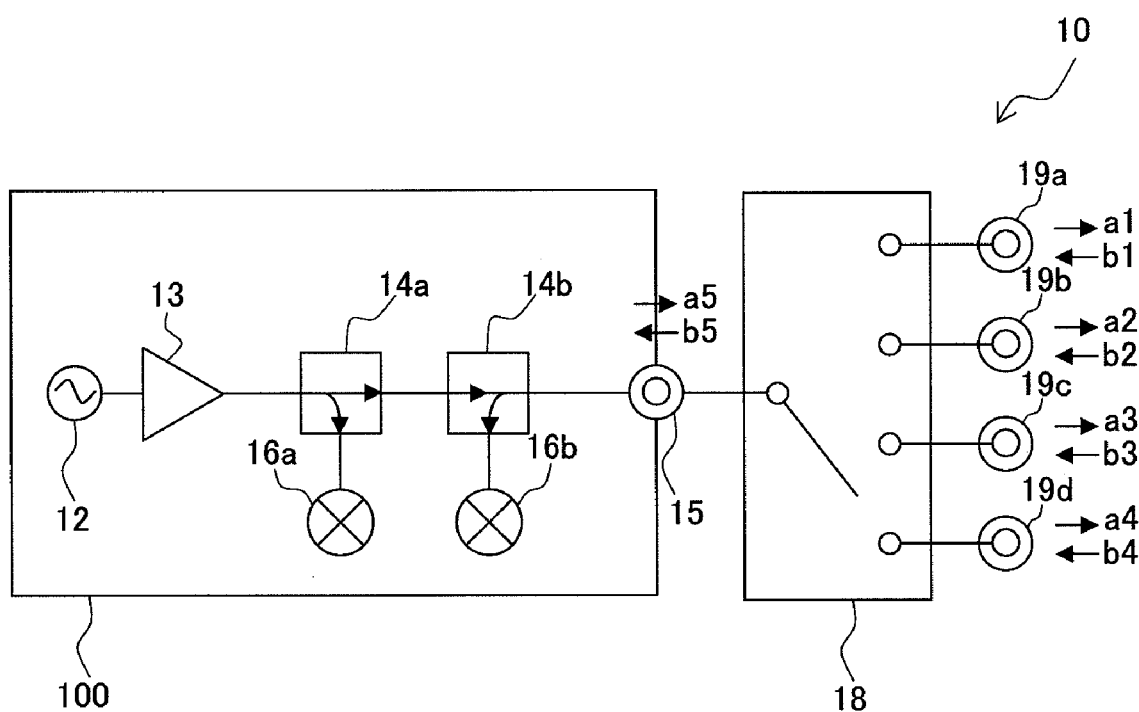
FIG. 3 shows a configuration of the switch branch signal source 10 if a signal source 100 had a terminal 15.

FIG. 3 shows a configuration of the switch branch signal source 10 if the signal source 100 had a terminal 15. The terminal 15 is a terminal used to connect the signal source 100 to the switch 18. It should be noted that a5 denotes an output of the terminal 15, and b5 denotes an output of the terminal 15 reflected back to the terminal 15.

Figure 4:
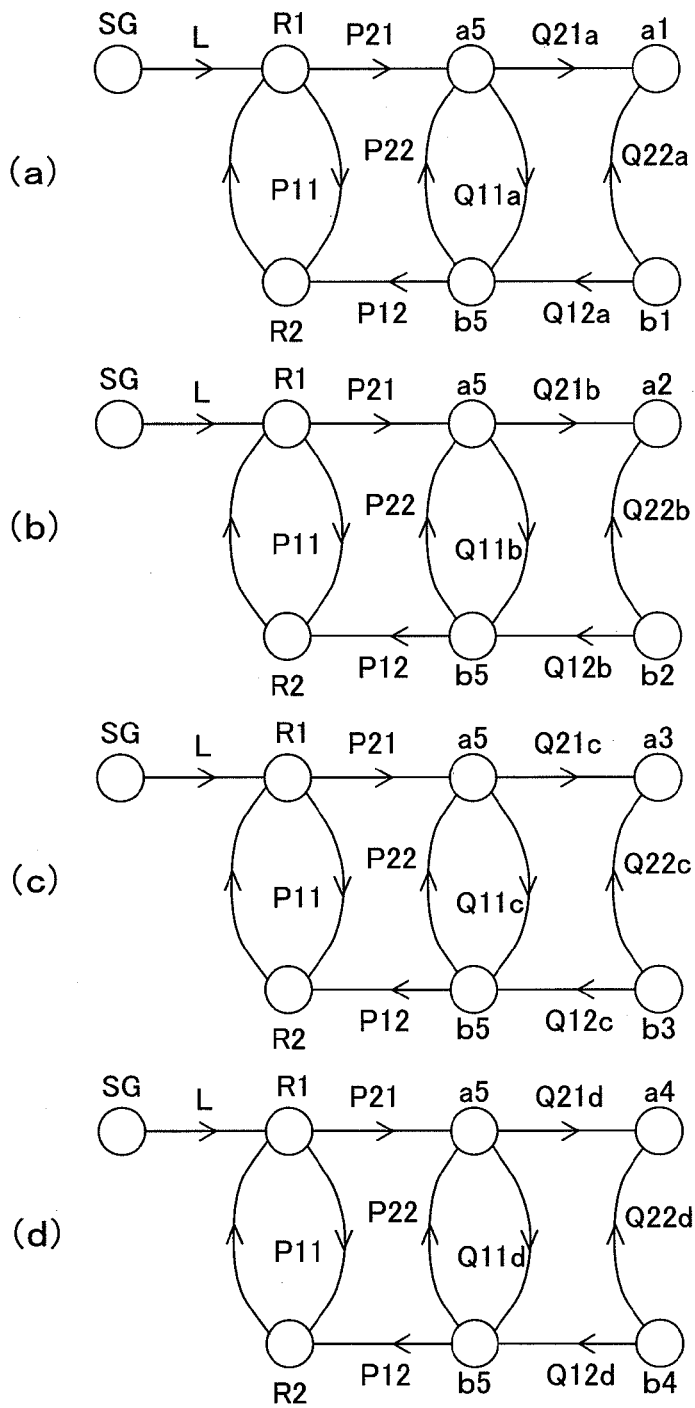
FIG. 4 shows signal flow graphs of the switch branch signal source 10 if the terminal 15 were present.

FIGS. 4(a) to 4(d) are signal flow graphs of the switch branch signal source 10 if the terminal 15 were present. FIG. 4(a) is a signal flow graph when the signal source 100 is connected to the output terminal 19a. FIG. 4(b) is a signal flow graph when the signal source 100 is connected to the output terminal 19b. FIG. 4(c) is a signal flow graph when the signal source 100 is connected to the output terminal 19c. FIG. 4(d) is a signal flow graph when the signal source 100 is connected to the output terminal 19d.

With reference to FIGS. 4(a) to 4(d), it is observed that if the signal source 100 is connected to any one of the output terminals 19a, 19b, 19c, and 19d, common error factors P11, P12, P21, and P22 are generated. The error factors P11, P12, P21, and P22 are error factors in the signal source 100, and are referred to as signal source error factors. The signal source error factors P11, P12, P21, and P22 are S parameters which are constant even if the temperature changes or the time elapses.

With reference to FIG. 4(a), it is observed that if the signal source 100 is connected to the output terminal 19a, error factors Q11a, Q12a, Q21a, and Q22a (S parameters) are generated. The error factors Q11a, Q12a, Q21a, and Q22a are error factors of the switch 18 if the signal source 100 is connected to the output terminal 19a, and are referred to as first switch portion error factors.

With reference to FIG. 4(b), it is observed that if the signal source 100 is connected to the output terminal 19b, error factors Q11b, Q12b, Q21b, and Q22b (S parameters) are generated. The error factors Q11b, Q12b, Q21b, and Q22b are error factors of the switch 18 if the signal source 100 is connected to the output terminal 19b, and are referred to as second switch portion error factors.

With reference to FIG. 4(c), it is observed that if the signal source 100 is connected to the output terminal 19c, error factors Q11c, Q12c, Q21c, and Q22c (S parameters) are generated. The error factors Q11c, Q12c, Q21c, and Q22c are error factors of the switch 18 if the signal source 100 is connected to the output terminal 19c, and are referred to as third switch portion error factors.

With reference to FIG. 4(d), it is observed that if the signal source 100 is connected to the output terminal 19d, error factors Q11d, Q12d, Q21d, and Q22d (S parameters) are generated. The error factors Q11d, Q12d, Q21d, and Q22d are error factors of the switch 18 if the signal source 100 is connected to the output terminal 19d, and are referred to as fourth switch portion error factors.

With reference to FIGS. 2(a) and 4(a), it is observed that the first port error factors E11a, E12a, E21a, and E22a are obtained by composing respectively the signal source error factors P11, P12, P21, and P22, and the first switch portion error factors Q11a, Q12a, Q21a, and Q22a.

Specifically, the first port error factors are represented by the following equations (1) to (4):

$$E11a = P11 + P21 P12 Q11a/(1 - P22 Q11a) \quad (1)$$

$$E21a = P21 Q21a/(1 - P22 Q11a) \quad (2)$$

$$E12a = P12 Q12a/(1 - P22 Q11a) \quad (3)$$

$$E22a = Q22a + Q21a Q12a P22/(1 - P22 Q11a) \quad (4)$$

With reference to FIGS. 2(b) and 4(b), it is observed that the second port error factors E11b, E12b, E21b, and E22b are obtained by composing respectively the signal source error factors P11, P12, P21, and P22, and the second switch portion error factors Q11b, Q12b, Q21b, and Q22b. The second port error factors are also represented by the equations (1) to (4) while the suffix "a" is replaced by "b".

With reference to FIGS. 2(c) and 4(c), it is observed that the third port error factors E11c, E12c, E21c, and E22c are obtained by composing respectively the signal source error factors P11, P12, P21, and P22, and the third switch portion error factors Q11c, Q12c, Q21c, and Q22c. The third port error factors are also represented by the equations (1) to (4) while the suffix "a" is replaced by "c".

With reference to FIGS. 2(d) and 4(d), it is observed that the fourth port error factors E11d, E12d, E21d, and E22d are obtained by composing respectively the signal source error factors P11, P12, P21, and P22, and the fourth switch portion error factors Q11d, Q12d, Q21d, and Q22d. The fourth port error factors are also represented by the equations (1) to (4) while the suffix "a" is replaced by "d".

Figure 5:
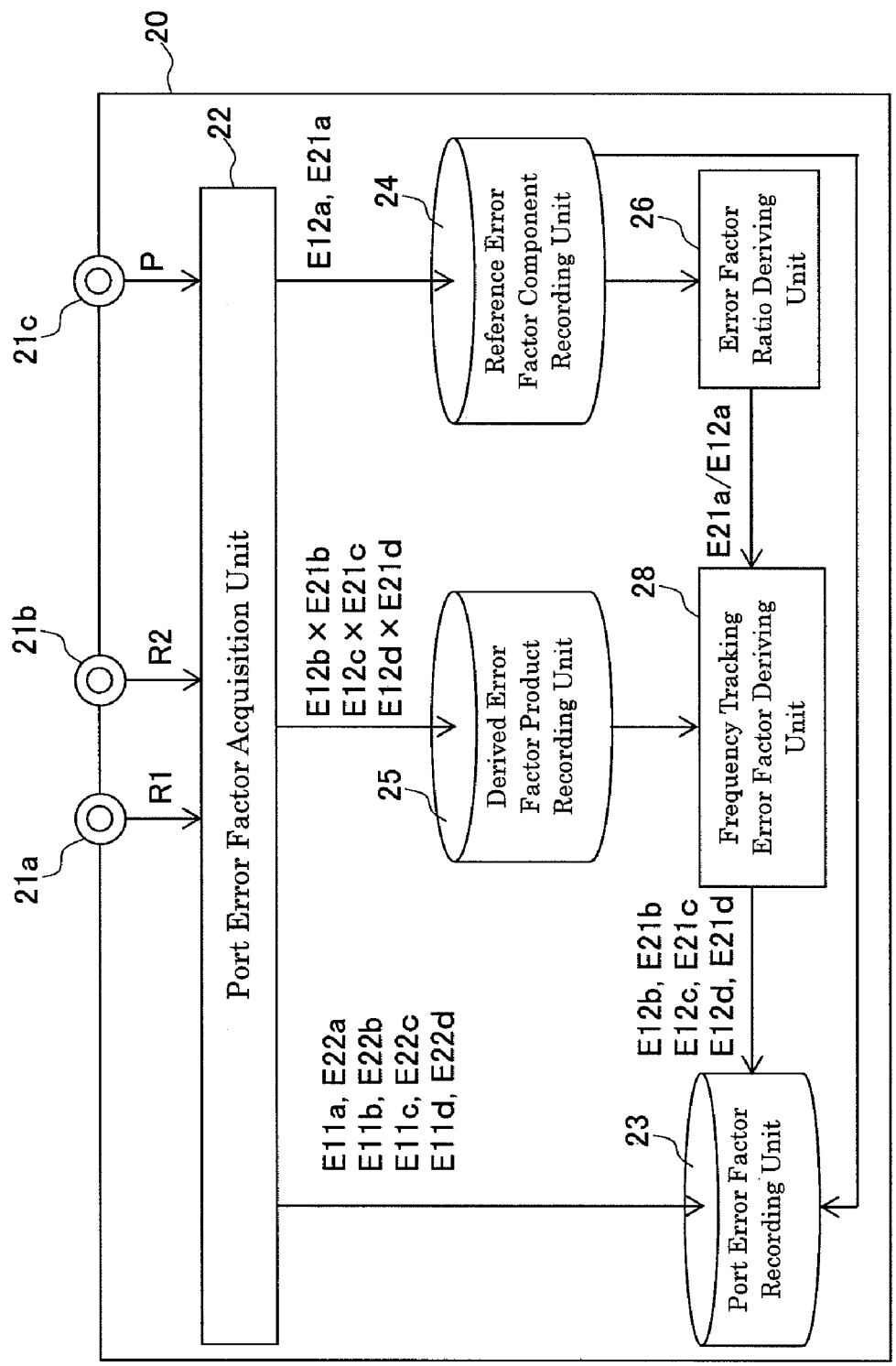
FIG. 5 is a functional block diagram showing a configuration of an error factor measurement device 20 according an embodiment of the present invention.

FIG. 5 is a functional block diagram showing a configuration of an error factor measurement device 20 according the embodiment of the present invention. The error factor measurement device 20 includes terminals 21a, 21b, and 21c, a port error factor acquisition unit 22, a port error factor recording unit 23, a reference error factor component recording unit 24, a derived error factor product recording unit 25, an error factor ratio deriving unit 26, and a frequency tracking error factor deriving unit 28.

The terminal 21a is a terminal which is connected to the mixer 16a of the switch branch signal source 10. The terminal 21b is a terminal which is connected to the mixer 16b of the switch branch signal source 10. The terminal 21c is a terminal which receives a measurement result of a power meter (detailed later) connected to the output terminal 19a of the switch branch signal source 10.

The port error factor acquisition unit 22 receives measurement results of the signal via the terminals 21a, 21b, and 21c while the output terminal (predetermined output terminal) 19a, and the output terminals 19b, 19c, and 19d other than the predetermined output terminal of the switch branch signal source 10 output the signal.

Figure 6:
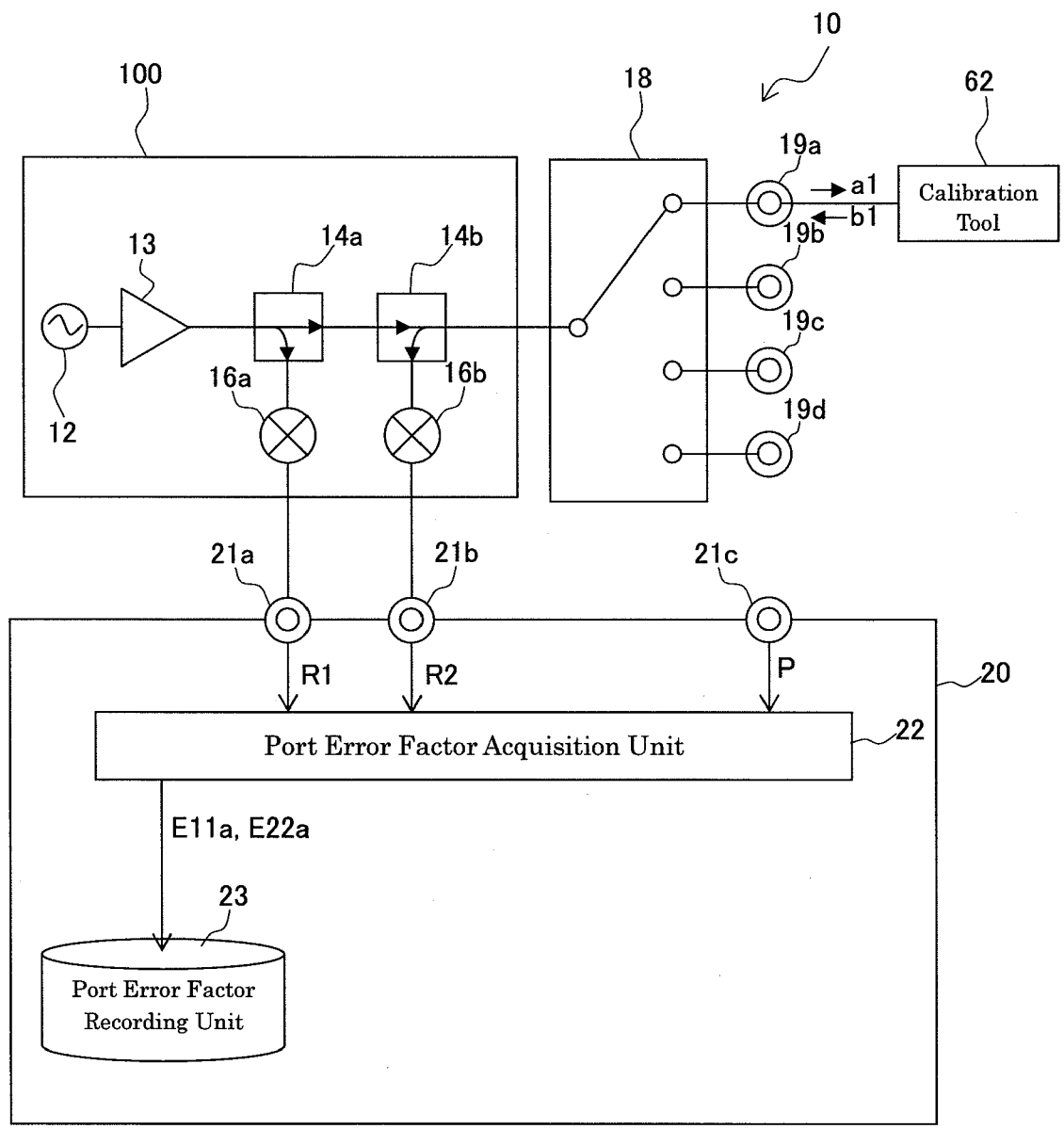
FIG. 6 shows the state in which a calibration tool 62 is connected to an output terminal 19a, and mixers 16a, 16b are respectively connected to terminals 21a, 21b.
Figure 8:
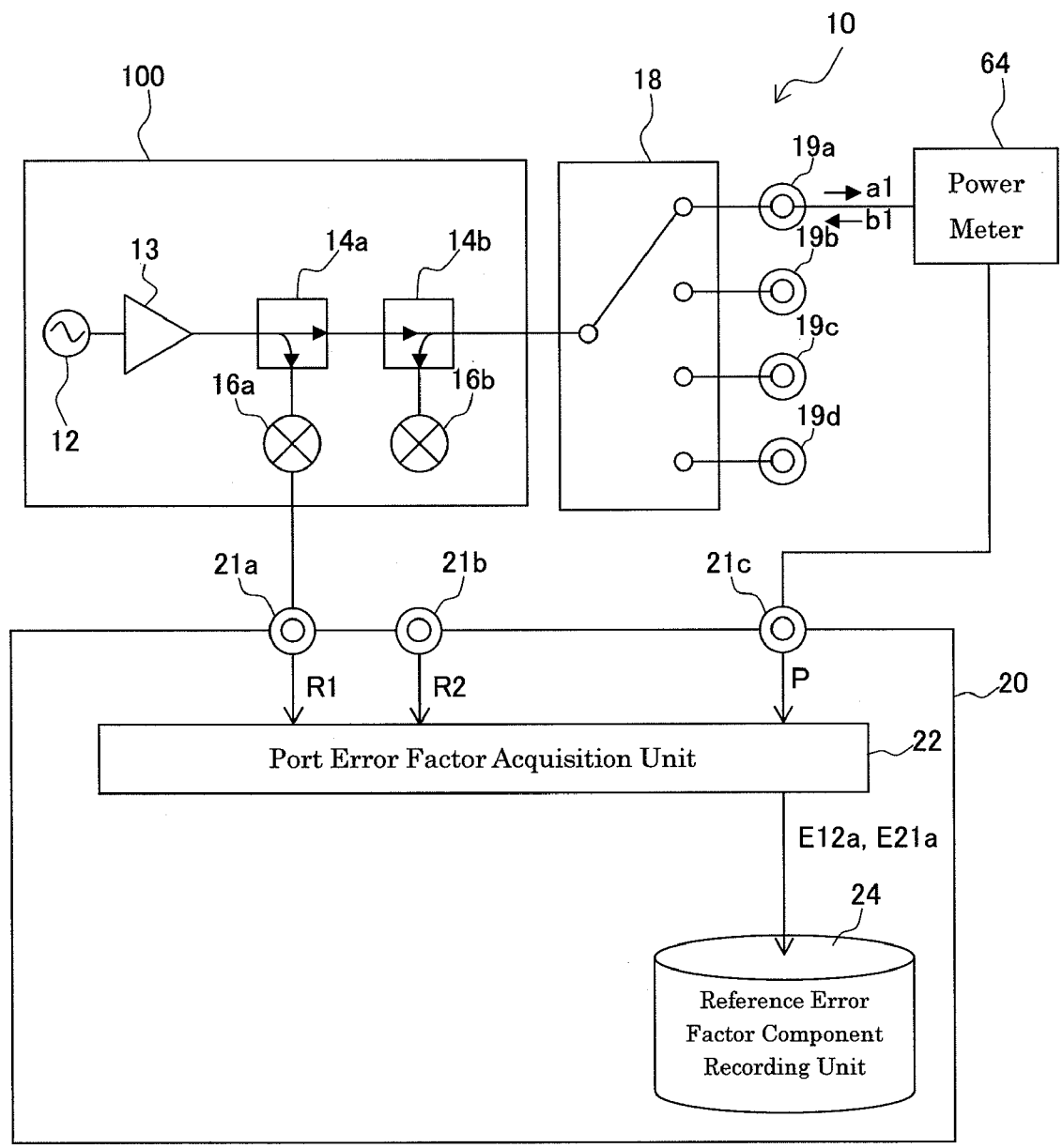
Figure 10:
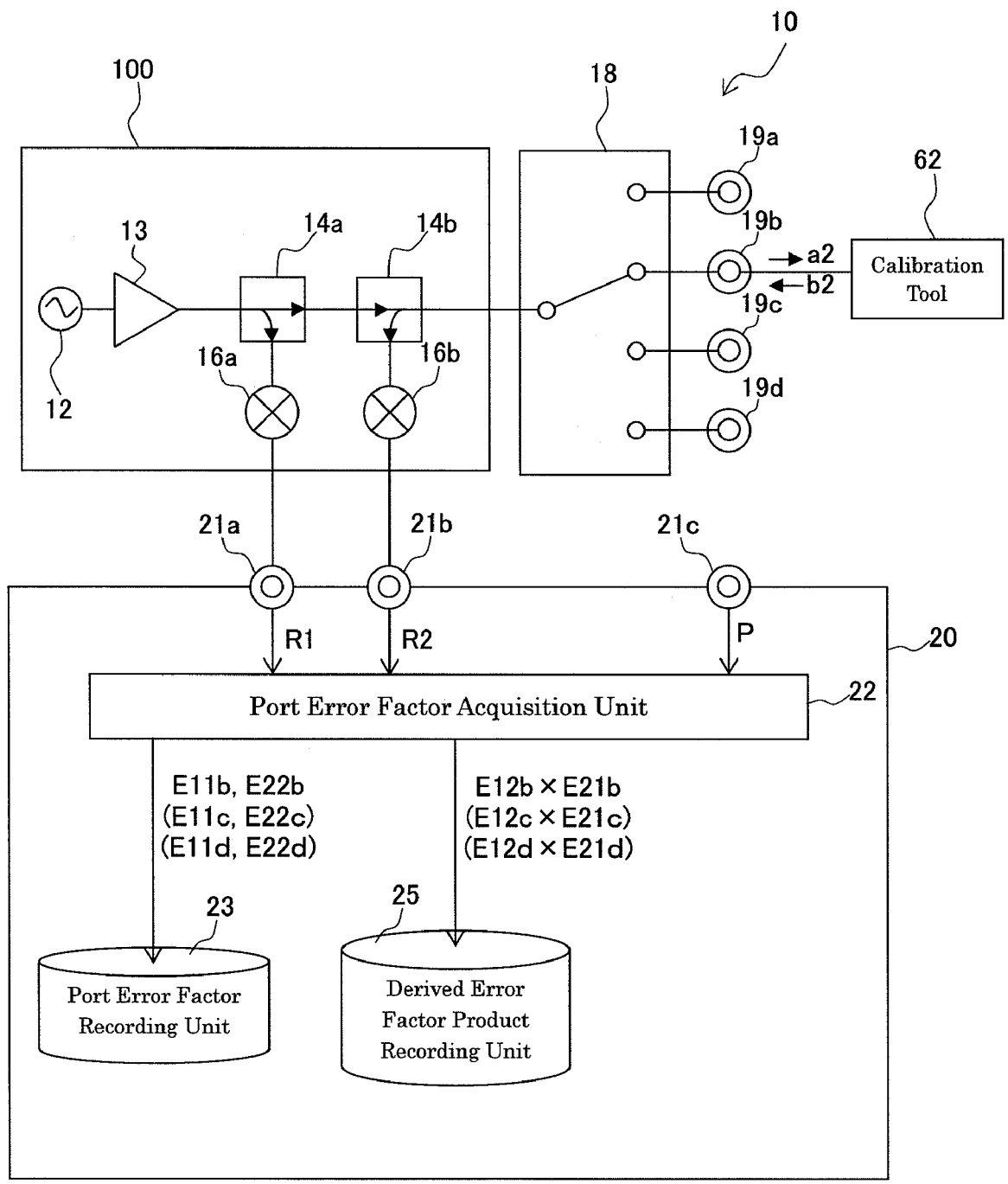
FIG. 10 shows the state in which the calibration tool 62 is connected to the output terminal 19b, and the mixers 16a, 16b are respectively connected to the terminals 21a, 21b.

With reference to FIGS. 6, 8, and 10, a brief description will now be given of what measurement results the terminals 21a, 21b, and 21c receive.

With reference to FIG. 6, while a calibration tool 62 (open, short-circuit, and standard load) is connected to the predetermined output terminal 19a, the terminals 21a and 21b respectively receive measurement results of the signal (signal before the first port error factor Eija is generated) and the reflected signal (signal reflected by the calibration tool 62).

Moreover, the port error factor acquisition unit 22 acquires E11a, E22a based on the measurement results acquired via terminals 21a, 21b in the state shown in FIG. 6, and causes the port error factor recording unit 23 to record E11a, E22a. It should be noted that E11a, E22a are components of the error factor of the switch branch signal source 10 when the predetermined output terminal 19a is connected to the signal source 100. E11a is a component caused by the direction of the switch branch signal source 10. E22a is a component caused by the source matching of the switch branch signal source 10.

With reference to FIG. 8, while a power meter 64 is connected to the predetermined output terminal 19a, the terminals 21a and 21c respectively receive the measurement results of the signal before the first port error factor Eija is generated and the signal output from the predetermined output terminal 19a.

Further, the port error factor acquisition unit 22 acquires E12a, E21a based on the measurement results acquired via the terminals 21a, 21c in the state shown in FIG. 8, and causes the reference error factor component recording unit 24 to record E12a, E21a. It should be noted that E12a, E21a are components of the error factor of the switch branch signal source 10 when the predetermined output terminal 19a is connected to the signal source 100. E21a is a component in the output direction (referred to as "reference output direction component") of the error factor caused by the frequency tracking in the switch branch signal source 10. Moreover, E12a is a component in the input direction (referred to as "reference input direction component") of the error factor caused by the frequency tracking in the switch branch signal source 10.

With reference to FIG. 10, while the calibration tool 62 (open, short-circuit, and standard load) is connected to the output terminal 19b other than the predetermined output terminal, the terminals 21a and 21b respectively receive the measurement results of the signal before the first port error factor Eija is generated and the reflected signal reflected by the calibration tool 62. It should be noted that the terminals 21a and 21b respectively receive the measurement results in the same manner while the calibration tool 62 is connected to the output terminal 19c other than the predetermined output terminal. Moreover, the terminals 21a and 21b respectively receive the measurement results in the same manner while the calibration tool 62 is connected to the output terminal 19d other than the predetermined output terminal.

Further, the port error factor acquisition unit 22 acquires E11b, E22b, E12b×E21b based on the measurement results acquired via the terminals 21a, 21b in the state shown in FIG. 10, causes the port error factor recording unit 23 to record E11b, E22b, and causes the derived error factor product recording unit 25 to record E12b×E21b. It should be noted that E11b, E22b, E12b, and E21b are components of the error factor of the switch branch signal source 10 when the output terminal 19b is connected to the signal source 100. E11b is a component caused by the direction of the switch branch signal source 10. E22b is a component caused by the source matching of the switch branch signal source 10. E12b is a component in the input direction (referred to as "derived input direction component") of the error factor caused by the frequency tracking in the switch branch signal source 10. E21b is a component in the output direction (referred to as "derived output direction component") of the error factor caused by the frequency tracking in the switch branch signal source 10.

Further, the port error factor acquisition unit 22 acquires E11c, E22c, E12c×E21c based on the measurement results acquired via the terminals 21a, 21b in the state in which the calibration tool 62 is connected to the output terminal 19c other than the predetermined output terminal, causes the port error factor recording unit 23 to record E11c, E22c, and causes the derived error factor product recording unit 25 to record E12c×E21c. It should be noted that E11c, E22c, E12c, and E21c are the components of the error factor of the switch branch signal source 10 when the output terminal 19c is connected to the signal source 100. E11c is a component caused by the direction of the switch branch signal source 10. E22c is a component caused by the source matching of the switch branch signal source 10. E12c is a component in the input direction (referred to as "derived input direction component") of the error factor caused by the frequency tracking in the switch branch signal source 10. E21c is a component in the output direction (referred to as "derived output direction component") of the error factor caused by the frequency tracking in the switch branch signal source 10.

Further, the port error factor acquisition unit 22 acquires E11d, E22d, E12d×E21d based on the measurement results acquired via the terminals 21a, 21b in the state in which the calibration tool 62 is connected to the output terminal 19d other than the predetermined terminal, causes the port error factor recording unit 23 to record E11d, E22d, and causes the derived error factor product recording unit 25 to record E12d×E21d. It should be noted that E11d, E22d, E12d, and E21d are the components of the error factor of the switch branch signal source 10 when the output terminal 19d is connected to the signal source 100. E11d is a component caused by the direction of the switch branch signal source 10. E22d is a component caused by the source matching of the switch branch signal source 10. E12d is a component in the input direction (referred to as "derived input direction component") of the error factor caused by the frequency tracking in the switch branch signal source 10. E21d is a component in the output direction (referred to as "derived output direction component") of the error factor caused by the frequency tracking in the switch branch signal source 10.

The port error factor recording unit 23 records the components E11a, E11b, E11c, and E11d caused by the direction of the switch branch signal source 10, and the components E22a, E22b, E22c, and E22d caused by the source matching of the switch branch signal source 10 of the error factor in the switch branch signal source 10 while the output terminals 19a, 19b, 19c, and 19d are respectively connected to the signal source 100.

The reference error factor component recording unit 24 records the reference output direction component E21a, and the reference input direction component E12a. Moreover, the reference error factor component recording unit 24 writes E21a, E12a in the port error factor recording unit 23.

The derived error factor product recording unit 25 records E12b×E21b, E12c×E21c, and E12d×E21d. E12b, E12c, and E12d are the derived input direction components, and E21b, E21c, and E21d are the derived output direction components. The derived error factor product recording unit 25 thus records the products (referred to as "error factor products") of the derived input direction component and the derived output direction component.

The error factor ratio deriving unit 26 derives an error factor ratio, which is a ratio of the reference output direction component E21a to the reference input direction component E12a based on the records in the reference error factor component recording unit 24. For example, the error factor ratio is E21a/E12a.

The frequency tracking error factor deriving unit 28 derives the derived output direction components E21b, E21c, and E21d, and the derived input direction components E12b, E12c, and E12d based on the error factor products recorded in the derived error factor product recording unit 25, and the error factor ratio E21a/E12a derived by the error factor ratio deriving unit 26.

On this occasion, it is assumed that the error factor ratio E21a/E12a is equal to ratios of the derived output direction component to the derived input direction component, E21b/E12b, E21c/E12c, and E21d/E12d. In other words, E21a/E12a=E21b/E12b=E21c/E12c=E21d/E12d.

The frequency tracking error factor deriving unit 28 derives the derived output direction component E21b and the derived input direction component E12b based on the error factor product E12b×E21b and the error factor ratio E21a/E12a (=E21b/E12b). It is assumed that E12b×E21b=A, E21a/E12a (=E21b/E12b)=B. Then, the derived output direction component E21b, and the derived input direction component E12b are derived as E21b=(A×B)$^{1/2}$, E12b=(A/B)$^{1/2}$. The derived output direction components E21c, E21d, and the derived input direction components E12c, E12d are derived in the same way.

It should be noted that the derived output direction components E21b, E21c, and E21d, and the derived input direction components E12b, E12c, and E12d are recorded in the port error factor recording unit 23. As a result, the first port error factor Eija, the second port error factor Eijb, the third port error factor Eijc, and the fourth port error factor Eijd are to be recorded in the port error factor recording unit 23.

A description will now be given of a proof for E21a/E12a=E21b/E12b=E21c/E12c=E21d/E12d.

First, the switch 18 has reciprocity, and Q21a=Q12a thus holds. Moreover, according to the equations (2) and (3), there holds, E21a/E12a=P21Q21a/(P12Q12a). Since Q21a=Q12a, there holds E21a/E12a=P21/P12.

For the second port error factor Eijb, the third port error factor Eijc, and the fourth port error factor Eijd, there hold E21b/E12b=P21/P12, E21c/E12c=P21/P12, and E21d/E12d=P21/P12.

Therefore, E21a/E12a=E21b/E12b=E21c/E12c=E21d/E12d (=P21/P12).

A description will now be given of an operation of the embodiment of the present invention.

First, the calibration tool 62 is connected to the predetermined output terminal 19a of the switch branch signal source 10, the mixer 16a of the switch branch signal source 10 is connected to the terminal 21a of the error factor measurement device 20, and the mixer 16b of the switch branch signal source 10 is connected to the terminal 21b of the error factor measurement device 20.

FIG. 6 shows the state in which the calibration tool 62 is connected to the output terminal 19a, and the mixers 16a, 16b are respectively connected to the terminals 21a, 21b. It should be noted that parts other than the terminals 21a, 21b, and 21c, the port error factor acquisition unit 22, and the port error factor recording unit 23 of the error factor measurement device 20 are not shown in FIG. 6.

Figure 7:
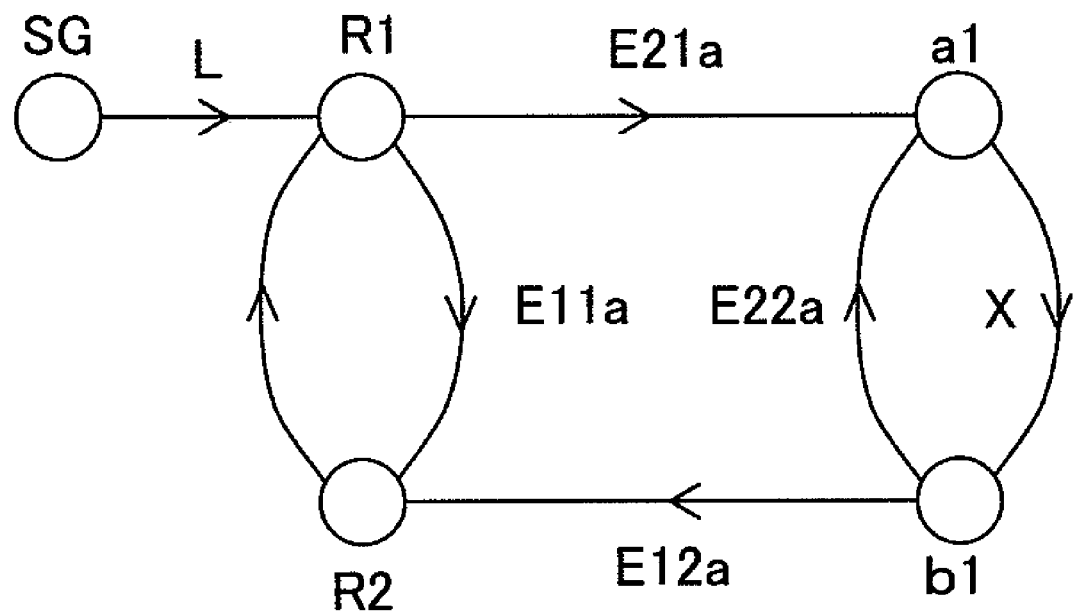
FIG. 7 is a signal flow graph representing the error factor measurement device 20 shown in FIG. 6.

FIG. 7 is a signal flow graph representing the error factor measurement device 20 shown in FIG. 6. R1 is a measurement result of the signal before the first port error factor Eija is generated. R2 is a measurement result of the reflected signal. It should be noted that the reflected signal is a resulting signal (b1) which is the signal (a1) output from the output terminal 19a and is then reflected by the calibration tool 62. Moreover, the signal (b1) reflected by the calibration tool 62 is fed to the bridge 14b via the switch 18. The reflected signal fed to the bridge 14b is fed to the mixer 16b, and is multiplied by the local signal. The output of the mixer 16b is R2. In FIG. 7, if L=1, the following equation (5) holds:

$$R2/R1=E11a+(E21a \cdot E12a \cdot X)/(1-E22a \cdot X) \tag{5}$$

It should be noted that X denotes a load coefficient of the calibration tool 62. The calibration tool 62 is a well-known tool which realizes the three types of states: open, short-circuit, and standard load Z0 (refer to patent document 1).

On this occasion, since the three types of the calibration tool 62 are connected, three types of the combination of R2 and R1 are acquired. As a result, the obtained variables are the three types of variable: E11a, E22a, and E12a×E21a. In this way, the port error factor acquisition unit 22 acquires E11a, E22a, and E12a×E21a. The acquired error factors E11a, E22a are recorded in the port error factor recording unit 23.

In other words, the port error factor acquisition unit 22 receives the measurement results (R1: the measurement result of the signal before the first port error factor Eija is generated, R2: the measurement result of the reflected signal) of the signal via the terminals 21a and the 21b in the state in which the signal is output from the output terminal (output terminal for measurement) 19a while the calibration tool 62 is connected to the output terminal 19a, and acquires the error factors E11a, E22a, and E12a×E21a for the predetermined output terminal 19a of the switch branch signal source 10.

Then, the power meter 64 is connected to the predetermined output terminal 19a of the switch branch signal source 10, and the mixer 16a of the switch branch signal source 10 is connected to the terminal 21a of the error factor measurement device 20.

FIG. 8 shows the state in which the power meter 64 is connected to the output terminal 19a, and the mixer 16a is connected to the terminal 21a. It should be noted that parts other than the terminals 21a, 21b, and 21c, the port error factor acquisition unit 22, and the reference error factor component recording unit 24 of the error factor measurement device 20 are not shown in FIG. 8.

Figure 9:
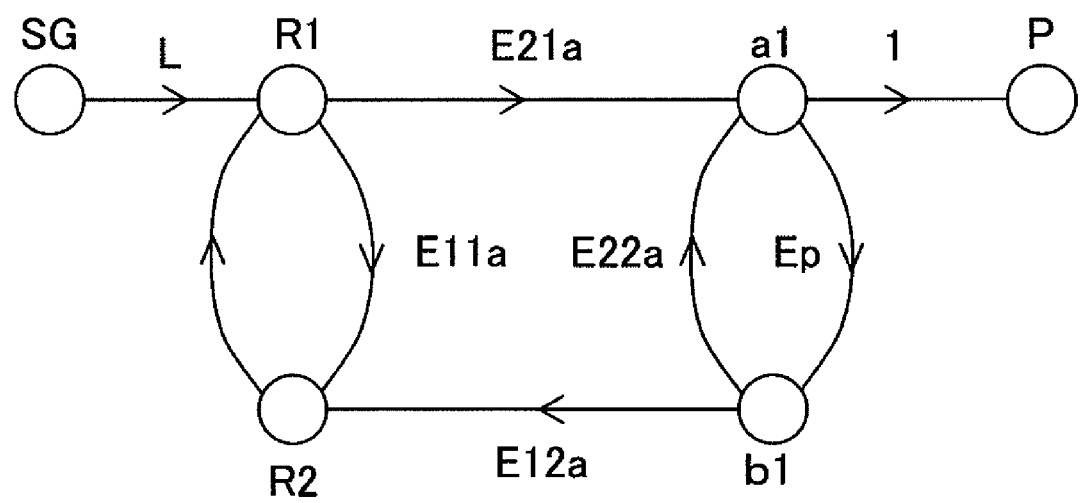
FIG. 9 is a signal flow graph representing the error factor measurement device 20 shown in FIG. 8.

FIG. 9 is a signal flow graph representing the error factor measurement device 20 shown in FIG. 8. In FIG. 9, if L=1, the following equation (6) holds:

$$P/R1=E21a/(1-E22a \cdot Ep) \tag{6}$$

It should be noted that P denotes a result of the measurement of the signal output from the predetermined output terminal 19a by the power meter 64. On this occasion, E22a has been acquired, Ep can be measured, and E21a is thus acquired. Since E12a×E21a has been acquired, E12a can also be acquired. In this way, the port error factor acquisition unit 22 acquires E11a, E22a, E12a, and E21a. The acquired E12a, E21a are to be recorded in the reference error factor component recording unit 24.

In other words, it is considered that the first port error factor acquisition unit 22 derives the reference output direction component E21a and the reference input direction component E12a based on the result P of the measurement of the signal output from the predetermined output terminal 19a. Moreover, it is considered that the first port error factor acquisition unit 22 derives the reference output direction component E21a and the reference input direction component E12a based on E22a and E12a×E21a derived based on the measurement results (R1: the measurement result of the signal before the first port error factor Ejia is generated, R2: the measurement result of the reflected signal) of the signal while the calibration tool 62 is connected to the predetermined output terminal 19a.

Moreover, the calibration tool 62 is connected to the predetermined output terminal 19b of the switch branch signal source 10, the mixer 16a of the switch branch signal source 10 is connected to the terminal 21a of the error factor measurement device 20, and the mixer 16b of the switch branch signal source 10 is connected to the terminal 21b of the error factor measurement device 20.

FIG. 10 shows the state in which the calibration tool 62 is connected to the output terminal 19b, and the mixers 16a, 16b are respectively connected to the terminals 21a, 21b. It should be noted that parts other than the terminals 21a, 21b, and 21c, the port error factor acquisition unit 22, the port error factor recording unit 23, and the derived error factor product recording unit 25 of the error factor measurement device 20 are not shown in FIG. 10.

A signal flow graph representing the error factor measurement device 20 in the state shown in FIG. 10 is the same as that shown in FIG. 7, and thus is not illustrated. With reference to FIG. 10, the following equation (7) holds.

$$R2/R1 = E11b + (E21b \cdot E12b \cdot X)/(1 - E22b \cdot X) \quad (7)$$

It should be noted that X denotes the load coefficient of the calibration tool 62. The calibration tool 62 is a well-known tool which realizes three types of states: open, short-circuit, and standard load Z0 (refer to patent document 1).

On this occasion, since the three types of the calibration tool 62 are connected, three types of the combination of R2 and R1 are acquired. As a result, the obtained variables are the three types of variable: E11b, E22b, and E12b×E21b. In this way, the port error factor acquisition unit 22 acquires E11b, E22b, E12b×E21b. The acquired error factors E11b, E22b are recorded in the port error factor recording unit 23. The acquired E12b×E21b is recorded in the derived error factor product recording unit 25.

In other words, the port error factor acquisition unit 22 receives the measurement results (R1: the measurement result of the signal before the second port error factor Eijb is generated, R2: the measurement result of the reflected signal) of the signal via the terminals 21a and the 21b in the state in which the signal is output from the output terminal 19b while the calibration tool 62 is connected to the output terminal 19b, and acquires the error factors E11b, E22b, and E12b×E21b (error factor product) for the output terminal 19b of the switch branch signal source 10 based on the measurement results.

Moreover, the calibration tool 62 is connected to the output terminal 19c while the mixers 16a, 16b are respectively connected to the terminals 21a, 21b. The port error factor acquisition unit 22 acquires E11c, E22c, and E12c×E21c as described above. The acquired error factors E11c, E22c are recorded in the port error factor recording unit 23. The acquired E12c×E21c is recorded in the derived error factor product recording unit 25. In other words, the port error factor acquisition unit 22 receives the measurement results (R1: the measurement result of the signal before the third port error factor Eijc is generated, R2: the measurement result of the reflected signal) of the signal via the terminals 21a and the 21b in the state in which the signal is output from the output terminal 19c while the calibration tool 62 is connected to the output terminal 19c, and acquires the error factors E11c, E22c, and E12c×E21c (error factor product) for the output terminal 19c of the switch branch signal source 10 based on the measurement results.

Moreover, the calibration tool 62 is connected to the output terminal 19d while the mixers 16a, 16b are respectively connected to the terminals 21a, 21b. The port error factor acquisition unit 22 acquires E11d, E22d, and E12d×E21d as described above. The acquired error factors E11d, E22d are recorded in the port error factor recording unit 23. The acquired E12d×E21d is recorded in the derived error factor product recording unit 25. In other words, the port error factor acquisition unit 22 receives the measurement results (R1: the measurement result of the signal before the fourth port error factor Eijd is generated, R2: the measurement result of the reflected signal) of the signal via the terminals 21a and the 21b in the state in which the signal is output from the output terminal 19d while the calibration tool 62 is connected to the output terminal 19d, and acquires the error factors E11d, E22d, and E12d×E21d (error factor product) for the output terminal 19d of the switch branch signal source 10 based on the measurement results.

The error factor ratio deriving unit 26 derives the error factor ratio E21a/E12a based on the records in the reference error factor component recording unit 24.

The frequency tracking error factor deriving unit 28 derives the derived output direction component E21b and the derived input direction component E12b based on the error factor product E12b×E21b recorded in the derived error factor product recording unit 25 and the error factor ratio E21a/E12a (=E21b/E12b).

The frequency tracking error factor deriving unit 28 derives the derived output direction component E21c and the derived input direction component E12c based on the error factor product E12c×E21c recorded in the derived error factor product recording unit 25 and the error factor ratio E21a/E12a (=E21c/E12c).

The frequency tracking error factor deriving unit 28 derives the derived output direction component E21d and the derived input direction component E12d based on the error factor product E12d×E21d recorded in the derived error factor product recording unit 25 and the error factor ratio E21a/E12a (=E21d/E12d).

The derived output direction components E21b, E21c, and E21d, and the derived input direction components E12b, E12c, and E12d are recorded in the port error factor recording unit 23. The port error factor recording unit 23 has already recorded E11a, E22a, E11b, E22b, E11c, E22c, E11d, and E22d. As a result, the first port error factor Eija, the second port error factor Eijb, the third port error factor Eijc, and the fourth port error factor Eijd are to be recorded in the port error factor recording unit 23.

According to the embodiment of the present invention, it is not necessary to connect the power meter 64 to the output terminals 19b, 19c, and 19d in order to derive the derived output direction components E21b, E21c, and E21d, and the derived input direction components E12b, E12c, and E12d. It is only necessary to connect the power meter 64 to the predetermined output terminal 19a. In other words, since it is not necessary to connect the power meter 64 to the output terminals 19b, 19c, and 19d, it is possible to easily carry out the calibration of the switch branch signal source 10.

A description will now be given of examples of an application form of the error factor measurement device 20.

Figure 11:
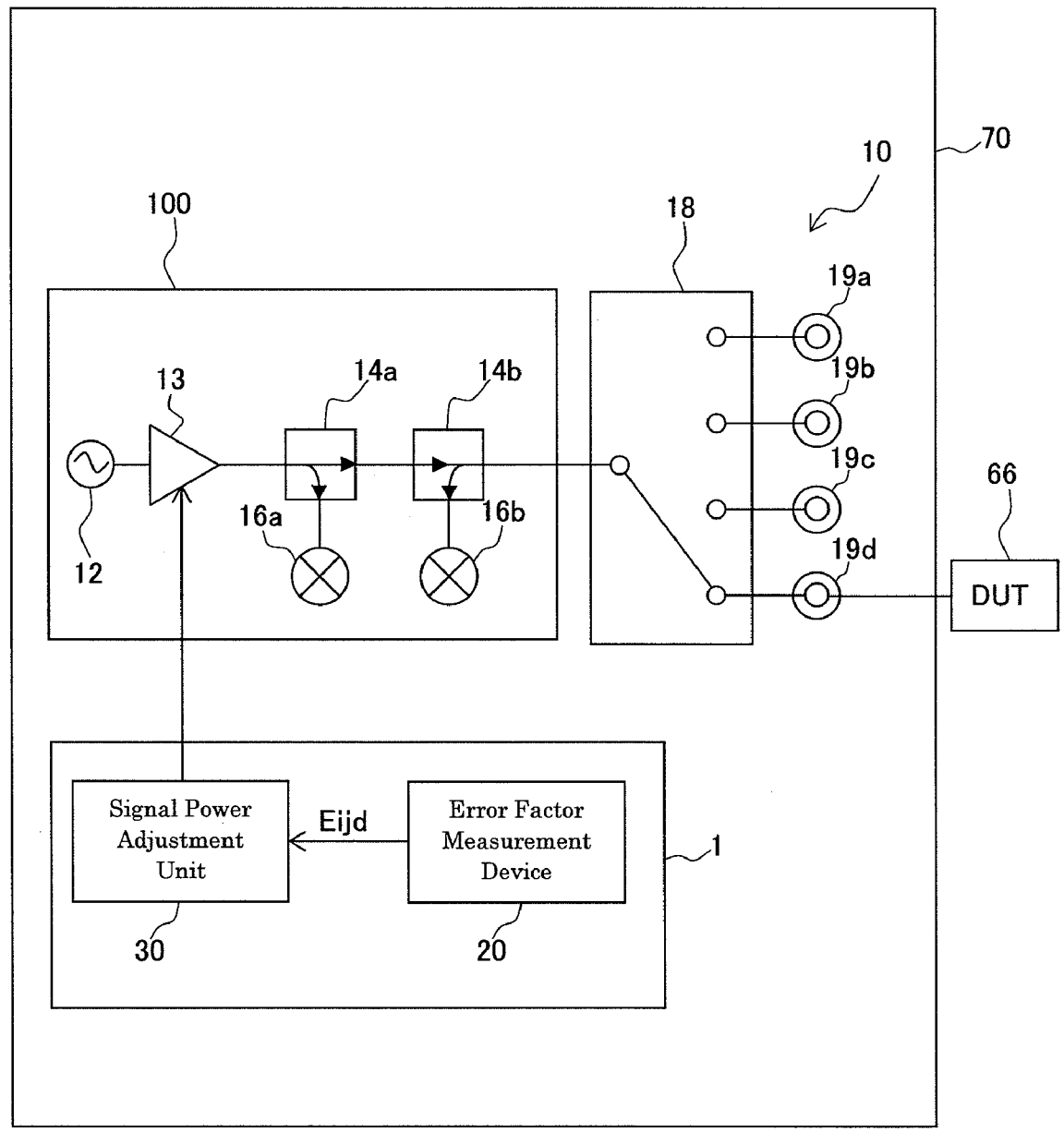
FIG. 11 shows an example of a configuration of an output correction device 1 when the error factor measurement device 20 is applied as an output correction device 1.

FIG. 11 shows an example of a configuration of an output correction device 1 when the error factor measurement device 20 is applied as the output correction device 1.

It is assumed that a signal is to be output from the output terminal 19d of the switch branch signal source 10. Moreover, the power of this signal is to be adjusted to a target value. On this occasion, it is necessary to adjust the gain of the amplifier 13 in consideration of the influence of the fourth port error factor Eijd.

The output correction device 1 includes the error factor measurement device 20 and a signal power adjustment unit 30. The error factor measurement device 20 is as detailed before, and feeds the fourth port error factor Eijd recorded in the port error factor recording unit 23 to the signal power adjustment unit 30. The signal power adjustment unit 30 adjusts the power of the signal based on the fourth port error factor Eijd measured by the error factor measurement device 20. For example, the signal power adjustment unit 30 adjusts the power of the signal by adjusting the gain of the amplifier 13, for example. This adjustment can adjust the power of the signal output from the output terminal 19d to the target value.

It should be noted that it is necessary to feed the first port error factor Eija from the port error factor recording unit 23 of the error factor measurement device 20 to the signal power adjustment unit 30 in order to adjust the power of the signal output from the output terminal 19a to the target value. The signal power adjustment unit 30 adjusts the power of the signal based on the first port error factor Eija measured by the error factor measurement device 20.

It should be noted that it is necessary to feed the second port error factor Eijb from the port error factor recording unit 23 of the error factor measurement device 20 to the signal power adjustment unit 30 in order to adjust the power of the signal output from the output terminal 19b to the target value. The signal power adjustment unit 30 adjusts the power of the signal based on the second port error factor Eijb measured by the error factor measurement device 20.

It should be noted that it is necessary to feed the third port error factor Eijc from the port error factor recording unit 23 of the error factor measurement device 20 to the signal power adjustment unit 30 in order to adjust the power of the signal output from the output terminal 19c to the target value. The signal power adjustment unit 30 adjusts the power of the signal based on the third port error factor Eijc measured by the error factor measurement device 20.

On this occasion, a tester (testing device) 70 may include the output correction device 1 and the switch branch signal source 10, and may feed a signal output from an output terminal (such as the output terminal 19d) to a device under test (DUT) 66. On this occasion, a module for test device including the error factor measurement device 20 may be provided on the tester 70.

Figure 12:
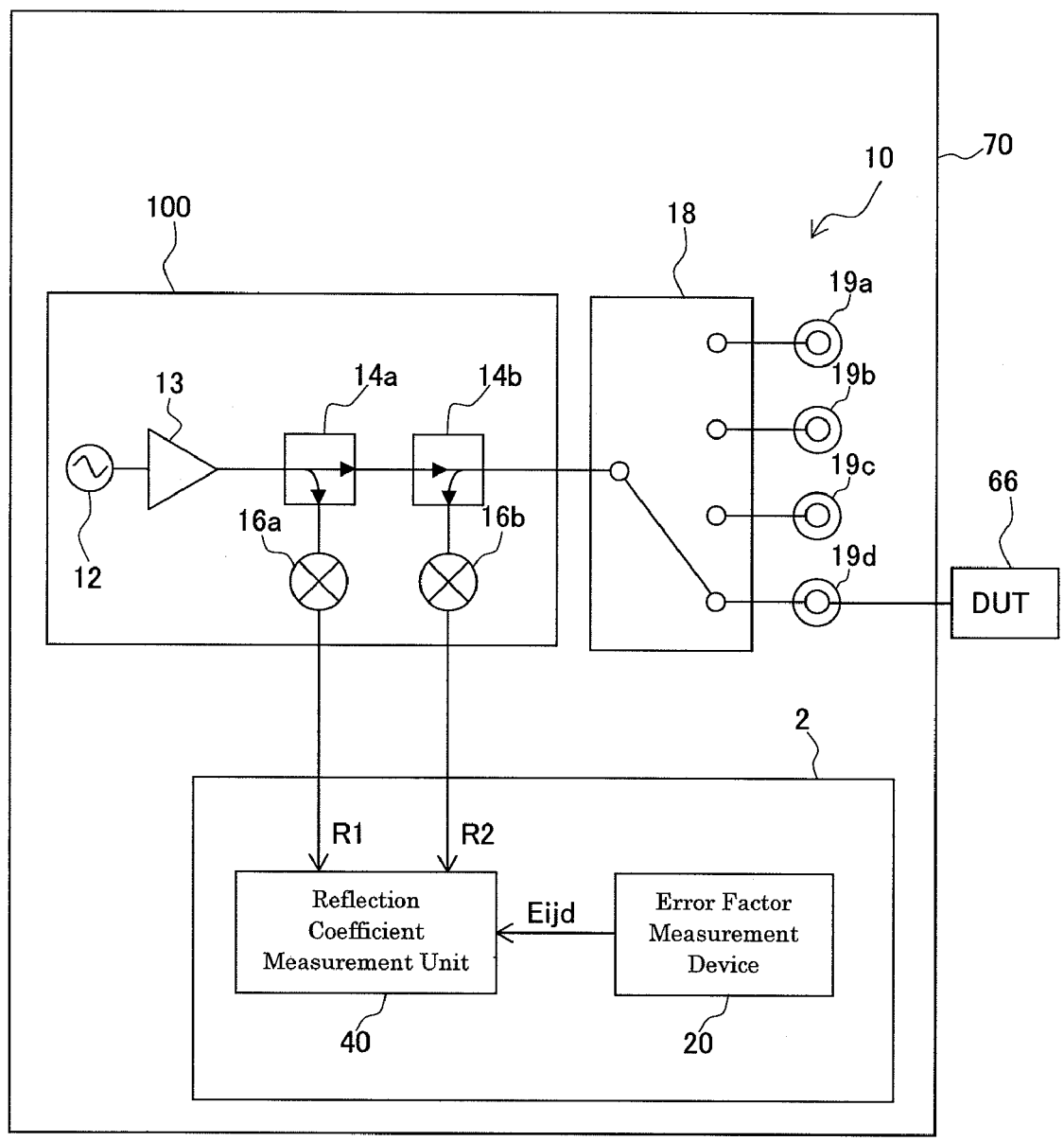
FIG. 12 shows an example of a configuration of a reflection coefficient measurement device 2 when the error factor measurement device 20 is applied to the reflection coefficient measurement device 2.

FIG. 12 shows an example of a configuration of a reflection coefficient measurement device 2 when the error factor measurement device 20 is applied to the reflection coefficient measurement device 2.

It is assumed that the device under test (DUT) 66 is connected to the output terminal 19d of the switch branch signal source 10 in order to measure the reflection coefficient of the DUT 66. It is possible to acquire the reflection coefficient of the DUT 66 based on R1 and R2. On this occasion, it is necessary to acquire the reflection coefficient in consideration of the influence of the fourth port error factor Eijd.

The reflection coefficient measurement device 2 includes the error factor measurement device 20 and a reflection coefficient measurement unit 40. The error factor measurement device 20 is as detailed before, and feeds the fourth port error factor Eijd recorded in the port error factor recording unit 23 to the reflection coefficient measurement unit 40. The reflection coefficient measurement unit 40 measures the reflection coefficient of the DUT 66 based on the result R1 of the measurement of the signal before the fourth port error factor Eijd is generated, the result R2 of the measurement of the signal resulting from the signal reflected by the DUT 66 (the signal resulting from the signal reflected by the DUT 66 is fed to the mixer 16b via the switch 18 and the bridge 14b), and the fourth port error factor Eijd measured by the error factor measurement device 20.

In order to measure the reflection coefficient of the DUT 66 connected to the output terminal 19a, the first port error factor Eija is to be fed from the port error factor recording unit 23 of the error factor measurement device 20 to the reflection coefficient measurement unit 40. The reflection coefficient measurement unit 40 measures the reflection coefficient of the DUT 66 based on R1, R2, and the first port error factor Eija measured by the error factor measurement device 20.

In order to measure the reflection coefficient of the DUT 66 connected to the output terminal 19b, the second port error factor Eijb is to be fed from the port error factor recording unit 23 of the error factor measurement device 20 to the reflection coefficient measurement unit 40. The reflection coefficient measurement unit 40 measures the reflection coefficient of the DUT 66 based on R1, R2, and the second port error factor Eijb measured by the error factor measurement device 20.

In order to measure the reflection coefficient of the DUT 66 connected to the output terminal 19c, the third port error factor Eijc is to be fed from the port error factor recording unit 23 of the error factor measurement device 20 to the reflection coefficient measurement unit 40. The reflection coefficient measurement unit 40 measures the reflection coefficient of the DUT 66 based on R1, R2, and the third port error factor Eijc measured by the error factor measurement device 20.

On this occasion, a tester (testing device) 70 may include the reflection coefficient measurement device 2 and the switch branch signal source 10 in order to test the device under test (DUT) 66 (the test method is widely known, and hence description thereof is omitted). On this occasion, a module for test device including the error factor measurement device 20 may be provided on the tester 70.

Moreover, the above-described embodiment may be realized in the following manner. A computer is provided with a CPU, a hard disk, and a media (such as a floppy disk (registered trade mark), a CD-ROM, or the like) reader, and the media reader is caused to read a medium recording a program realizing the above-described respective components (such as the error factor measuring device 20), thereby installing the program on the hard disk. This method may also realize the above-described functions.

The invention claimed is:

1. An error factor measurement device that measures an error factor in a switch branch signal source comprising a signal source which generates a signal, and a switch which outputs the signal from any one of multiple output terminals, the error factor measurement device comprising:

a reference error factor component recorder that records a component in an output direction (referred to as "reference output direction component") and a component in an input direction (referred to as "reference input direction component") of an error factor caused by frequency tracking in the switch branch signal source upon any predetermined one of the multiple output terminals being connected to the signal source;

a derived error factor product recorder that records an error factor product of a component in the output direction (referred to as "derived output direction component") and a component in the input direction (referred to as "derived input direction component") of an error factor caused by frequency tracking in the switch branch signal source upon respective multiple output terminals other than the predetermined one of the multiple output terminals being connected to the signal source;

an error factor ratio deriver that derives an error factor ratio, which is a ratio of the reference output direction component to the reference input direction component, based on records of said reference error factor component recorder; and a frequency tracking error factor deriver that derives the derived output direction component and the derived input direction component based on the error factor product recorded in said derived error factor product recorder and the error factor ratio derived by said error factor ratio deriver;

wherein said frequency tracking error factor deriver derives the derived output direction component and the derived input direction component assuming that the error factor ratio is equal to the ratio of the derived output direction component to the derived input direction component.

2. The error factor measurement device according to claim 1, comprising an error factor recorder that records a component caused by the direction of the switch branch signal source, and a component caused by source matching of the switch branch signal source of the error factor in the switch branch signal source when the respective multiple output terminals are connected to the signal source.

3. The error factor measurement device according to claim 1, wherein the reference output direction component and the reference input direction component recorded in said reference error factor component recorder are derived based on a result of a measurement of an output from the predetermined one of the multiple output terminals, and a result of a measurement of the signal before the error factor is generated, and a result of a measurement of a reflection of the signal while a calibration tool is connected to the predetermined one of the multiple output terminals, and the calibration tool realizes three states including an open state, a short-circuit state, and a standard load state.

4. The error factor measurement device according to claim 1, wherein the error factor product recorded in said derived error factor product recorder is derived based on a result of a measurement of the signal before the error factor is generated, and a result of a measurement of a reflection of the signal while a calibration tool is connected to the respective multiple output terminals other than the predetermined one of the multiple output terminals, and the calibration tool realizes three states including an open state, a short-circuit state, and a standard load state.

5. An output correction device comprising:
the error factor measurement device according to claim 1; and
a signal power adjuster that adjusts power of the signal based on the error factor measured by said error factor measurement device.

6. A test device comprising the output correction device according to claim 5, wherein the signal is fed to a device under test.

7. A reflection coefficient measurement device comprising:
the error factor measurement device according to claim 1; and
a reflection coefficient measurer that measures a reflection coefficient of a device under test based on a result of a measurement of the signal before the error factor is generated, a result of a measurement of a reflection of the signal, and the error factor measured by said error factor measurement device while the device under test is connected to any one of the multiple output terminals.

8. A test device for testing a device under test comprising the reflection coefficient measurement device according to claim 7.

9. A module for a test device comprising the error factor measurement device according to claim 1.

10. An error factor measurement method that measures an error factor in a switch branch signal source comprising a signal source which generates a signal, and a switch which outputs the signal from any one of multiple output terminals, the error factor measurement method comprising:

a component in an output direction (referred to as "reference output direction component") and a component in an input direction (referred to as "reference input direction component") of an error factor caused by frequency tracking in the switch branch signal source upon any predetermined one of the multiple output terminals being connected to the signal source;

recording an error factor product of a component in the output direction (referred to as "derived output direction component") and a component in the input direction (referred to as "derived input direction component") of an error factor caused by frequency tracking in the switch branch signal source upon respective multiple output terminals other than the predetermined one of the multiple output terminals being connected to the signal source;

deriving an error factor ratio, which is a ratio of the reference output direction component to the reference input direction component, based on records of said reference error factor component recording; and deriving a frequency tracking error factor by deriving the derived output direction component and the derived input direction component based on the error factor product recorded in said derived error factor product recording step and the error factor ratio derived by said error factor ratio deriving;

wherein said frequency tracking error factor deriving derives the derived output direction component and the derived input direction component assuming that the error factor ratio is equal to the ratio of the derived output direction component to the derived input direction component.

11. A program of instructions for execution by the computer to perform an error factor measurement processing that measures an error factor in a switch branch signal source comprising a signal source which generates a signal, and a switch which outputs the signal from any one of multiple output terminals, the error factor measurement processing comprising:

recording a component in an output direction (referred to as "reference output direction component") and a component in an input direction (referred to as "reference input direction component") of an error factor caused by frequency tracking in the switch branch signal source upon any predetermined one of the multiple output terminals being connected to the signal source;

recording an error factor product of a component in the output direction (referred to as "derived output direction component") and a component in the input direction (referred to as "derived input direction component") of an error factor caused by frequency tracking in the switch branch signal source upon respective multiple output terminals other than the predetermined one of the multiple output terminals being connected to the signal source;

deriving an error factor ratio, which is a ratio of the reference output direction component to the reference input direction component, based on records of said reference error factor component recording; and deriving a frequency tracking error factor by deriving the derived output direction component and the derived input direction component based on the error factor product recorded in said derived error factor product recording and the error factor ratio derived by said error factor ratio deriving;

wherein said frequency tracking error factor deriving derives the derived output direction component and the derived input direction component assuming that the error factor ratio is equal to the ratio of the derived output direction component to the derived input direction component.

12. A computer-readable medium having a program of instructions for execution by the computer to perform an error factor measurement processing that measures an error factor in a switch branch signal source comprising a signal source which generates a signal, and a switch which outputs the signal from any one of multiple output terminals, the error factor measurement processing comprising:

recording a component in an output direction (referred to as "reference output direction component") and a component in an input direction (referred to as "reference input direction component") of an error factor caused by frequency tracking in the switch branch signal source upon any predetermined one of the multiple output terminals being connected to the signal source;

recording an error factor product of a component in the output direction (referred to as "derived output direction component") and a component in the input direction (referred to as "derived input direction component") of an error factor caused by frequency tracking in the switch branch signal source upon respective multiple output terminals other than the predetermined one of the multiple output terminals being connected to the signal source;

deriving an error factor ratio, which is a ratio of the reference output direction component to the reference input direction component, based on records of said reference error factor component recording; and deriving a frequency tracking error factor by deriving the derived output direction component and the derived input direction component based on the error factor product recorded in said derived error factor product recording and the error factor ratio derived by said error factor ratio deriving;

wherein said frequency tracking error factor deriving step derives the derived output direction component and the derived input direction component assuming that the error factor ratio is equal to the ratio of the derived output direction component to the derived input direction component.

* * * * *

UNITED STATES PATENT AND TRADEMARK OFFICE
CERTIFICATE OF CORRECTION

PATENT NO. : 7,616,007 B2
APPLICATION NO. : 11/864086
DATED : November 10, 2009
INVENTOR(S) : Y. Nakayama It is certified that error appears in the above-identified patent and that said Letters Patent is hereby corrected as shown below:

At column 18, line 8 (claim 10, line 6) of the printed patent, add --recording-- before "a".

At column 18, line 32 (claim 10, line 30) of the printed patent, delete "step" after "recording".

At column 20, line 20 (claim 12, line 34) of the printed patent, delete "step" after "deriving".

Signed and Sealed this

Eighth Day of June, 2010

David J. Kappos
*Director of the United States Patent and Trademark Office*